(12) United States Patent
Yin et al.

(10) Patent No.: US 8,596,472 B2
(45) Date of Patent: Dec. 3, 2013

(54) ELECTRONIC DEVICE ENCLOSURE

(75) Inventors: Xiu-Zhong Yin, Shenzhen (CN);
Xiu-Quan Hu, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/525,615

(22) Filed: Jun. 18, 2012

(65) Prior Publication Data
US 2013/0092644 A1 Apr. 18, 2013

(30) Foreign Application Priority Data
Oct. 17, 2011 (CN) .......................... 2011 1 0314566

(51) Int. Cl.
*H05K 7/14* (2006.01)
(52) U.S. Cl.
USPC ............................ 211/26; 361/726; 312/223.2
(58) Field of Classification Search
USPC ........ 211/26, 26.1, 26.2, 41.12, 88.01, 90.02, 211/126.1, 126.2, 126.4, 186, 187; 312/223.1, 223.2, 265.5, 265.6; 361/679.33, 679.34, 679.35, 679.36, 361/679.37, 724, 725, 726, 727
See application file for complete search history.

(56) References Cited

U.S. PATENT DOCUMENTS

| | | | | |
|---|---|---|---|---|
| 4,947,661 A * | 8/1990 | Yoshida | ............................ | 70/57 |
| 6,123,314 A * | 9/2000 | Steele | ........................... | 248/681 |
| 6,310,783 B1 * | 10/2001 | Winch et al. | .................. | 361/797 |
| 6,404,641 B1 * | 6/2002 | Fisk et al. | ..................... | 361/727 |
| 7,447,010 B2 * | 11/2008 | Chen | ......................... | 361/679.33 |
| 7,697,279 B2 * | 4/2010 | Yeh et al. | ................. | 361/679.39 |
| 8,068,335 B2 * | 11/2011 | Yang et al. | ............... | 361/679.33 |
| 8,096,627 B2 * | 1/2012 | Lin | ............................. | 312/325 |
| 8,215,599 B2 * | 7/2012 | Schaupensteiner | ...... | 248/221.11 |
| 8,238,096 B2 * | 8/2012 | Zhen et al. | .............. | 361/679.58 |
| 2008/0123280 A1 * | 5/2008 | Chen et al. | .................... | 361/685 |
| 2010/0264787 A1 * | 10/2010 | Fan et al. | .................... | 312/223.2 |
| 2012/0018214 A1 * | 1/2012 | Tsai et al. | ..................... | 174/535 |
| 2012/0087084 A1 * | 4/2012 | Nguyen et al. | ........... | 361/679.37 |
| 2012/0243167 A1 * | 9/2012 | Chen et al. | ............... | 361/679.31 |
| 2013/0087518 A1 * | 4/2013 | He | ................................. | 211/26 |

* cited by examiner

*Primary Examiner* — Joshua Rodden
(74) *Attorney, Agent, or Firm* — Altis & Wispro Law Group, Inc.

(57) ABSTRACT

An electronic device enclosure includes a chassis, a receiving tray, and a clipping assembly. The chassis includes a side plate and a blocking pin located on the side plate. The receiving tray includes a bottom panel and a side panel connected to the bottom panel. An opening is defined in the receiving tray and located between the bottom panel and the side panel, and the blocking pin is engaged in the opening. The clipping assembly includes a first pivoting member rotatably attached to the side panel. The first pivoting member extends towards the opening to abut the blocking pin, for prevent the receiving tray from moving out of the chassis, and the first pivoting member is rotatable to disengage from the blocking pin, for allowing the receiving tray from moving out of the chassis.

16 Claims, 6 Drawing Sheets

US 8,596,472 B2

ELECTRONIC DEVICE ENCLOSURE

BACKGROUND

1. Technical Field

The present disclosure relates to electronic devices, more particularly to an electronic device enclosure.

2. Description of Related Art

Electronic device enclosures, such as for servers, often include a chassis and a plurality of receiving trays received in the chassis. The trays are used to receive electronic components, such as a motherboard and storage devices. The trays are secured to the chassis with screws. However, using screws to attach the trays is very laborious and time-consuming. Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
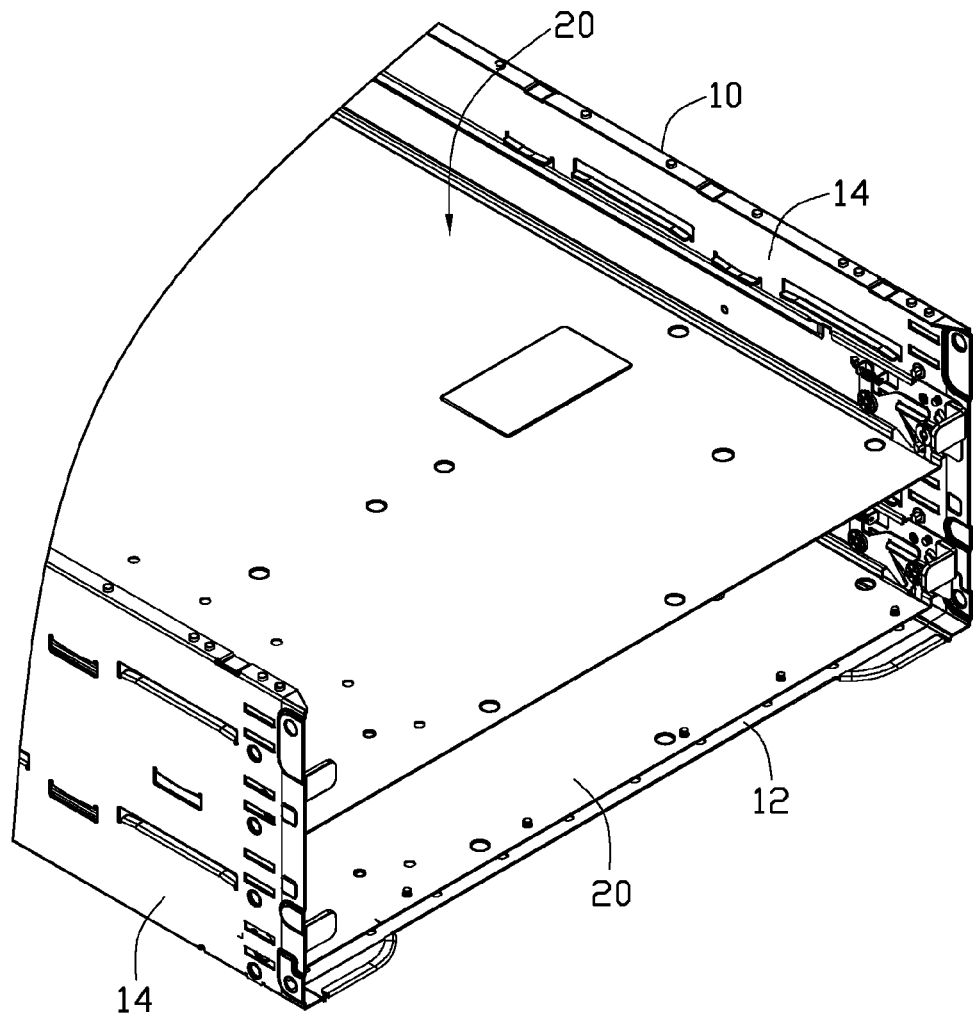
FIG. 1 is an isometric partial view of an electronic device enclosure in accordance with an embodiment.
Figure 2:
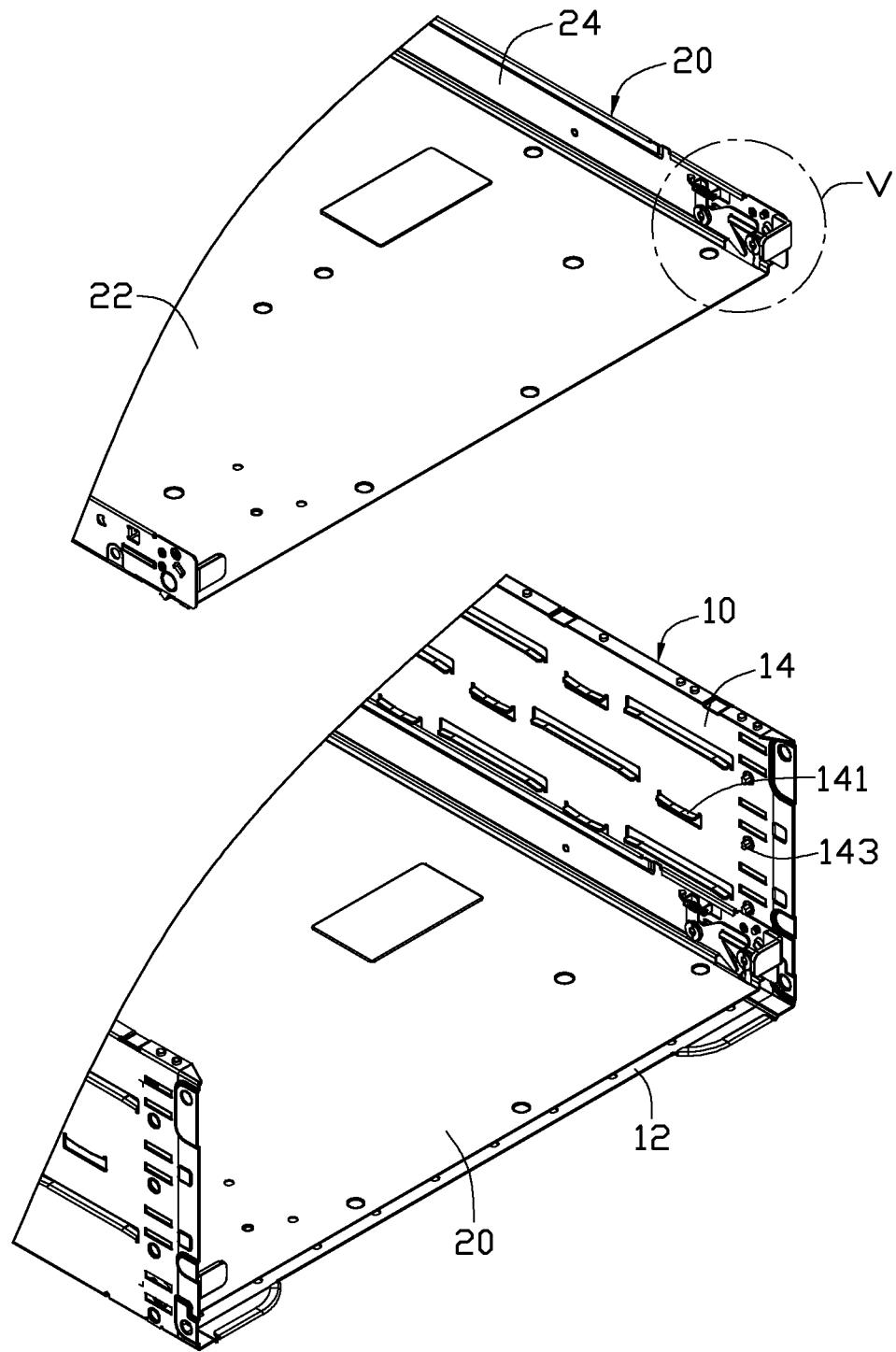
FIG. 2 is an exploded, isometric view of the electronic device enclosure of FIG. 1.

Referring to FIGS. 1 and 2, an electronic device enclosure in accordance with an embodiment includes a chassis 10, at least one receiving tray 20 attached to the chassis 10, and a clipping assembly 30 attached to each of the at least one receiving tray 20.

The chassis 10 includes a bottom plate 12 and two opposite side plates 14 connected to the bottom plate 12. A plurality of supporting pieces 141 extend from each of the two side plates 14, and each of the plurality of supporting pieces 141 is substantially parallel to the bottom plate 12. A plurality of blocking pins 143 protrude from each of the two side plates 14. In one embodiment, the plurality of blocking pins 143 are arranged in a straight line that is substantially perpendicular to the bottom plate 12.

Figure 3:
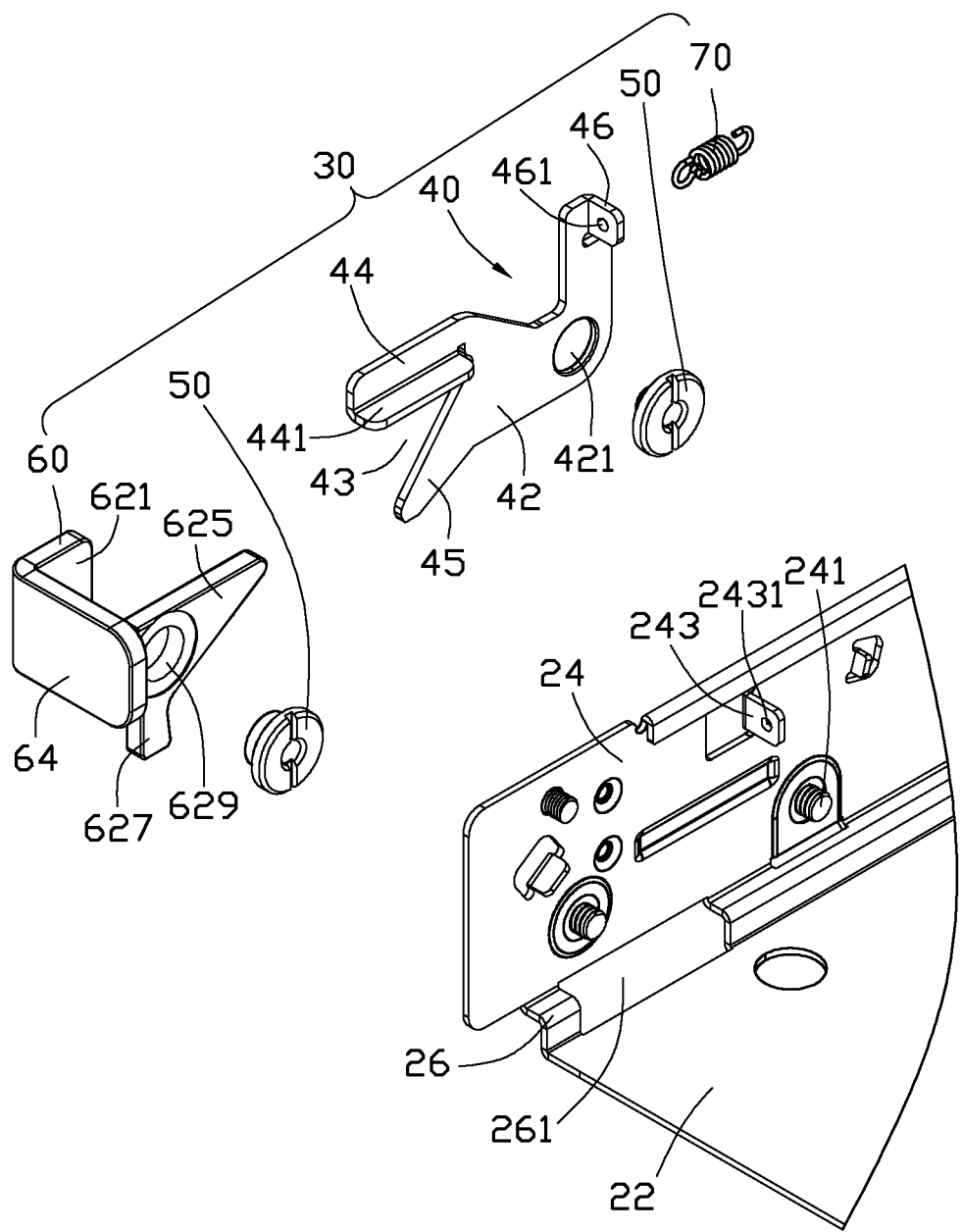
FIG. 3 is an exploded, isometric view of a receiving tray and a clipping assembly of the electronic device enclosure of FIG. 2.

Referring to FIGS. 2 and 3, the receiving tray 20 includes a bottom panel 22 and a pair of side panels 24 substantially perpendicular to the bottom panel 22. A pair of mounting posts 241 is located on each of the pair of side panels 24. Securing tabs 243, each with a securing hole 2431, perpendicularly extend from top edges of the side panels 24 respectively. A connecting panel 26 is connected to the bottom panel 22 and each of the side panels 24. An opening 261 is defined in the front of each side panel 24. In one embodiment, the connecting panel 26 is L-shaped.

The clipping assembly 30 includes a first pivoting member 40, a pair of nuts 50, a second pivoting member 60, and a resilient member 70. The first pivoting member 40 includes a main body 42, and the main body 42 defines a pivot hole 421. A first resisting portion 44 and a second resisting portion 45 are located on a first end of the main body 42. A cutout 43 is defined between the first resisting portion 44 and the second resisting portion 45, and a blocking tab 441 extends from the first resisting portion 44 towards the cutout 43. In one embodiment, the cutout 43 is triangular. A flange 46, with a mounting hole 461 defined therein, is located on a second opposite end of the main body 42. In one embodiment, the flange 46 is substantially perpendicular to the main body 42 and the blocking tab 441, and the flange 46 is above the pivot hole 421.

Figure 4:
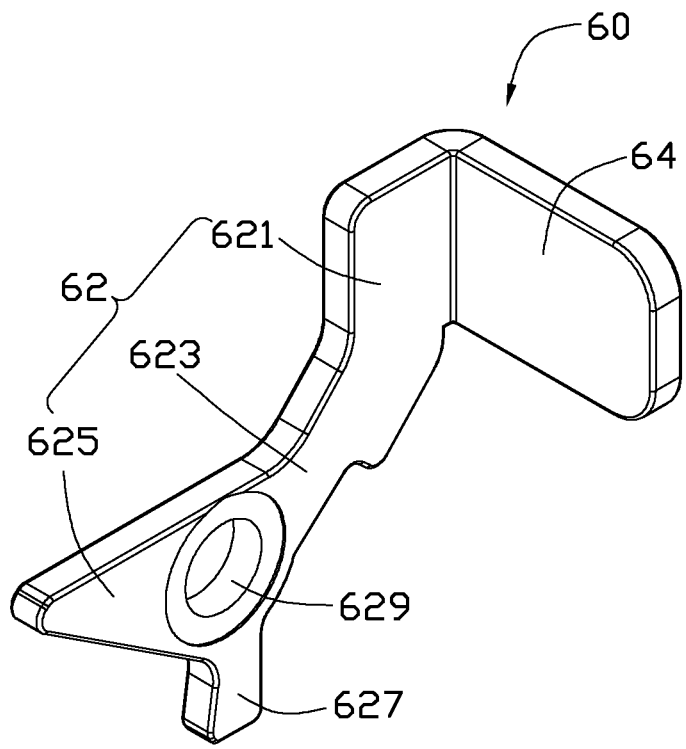
FIG. 4 is an isometric view of a second pivoting member of the clipping assembly of FIG. 3.
Figure 5:
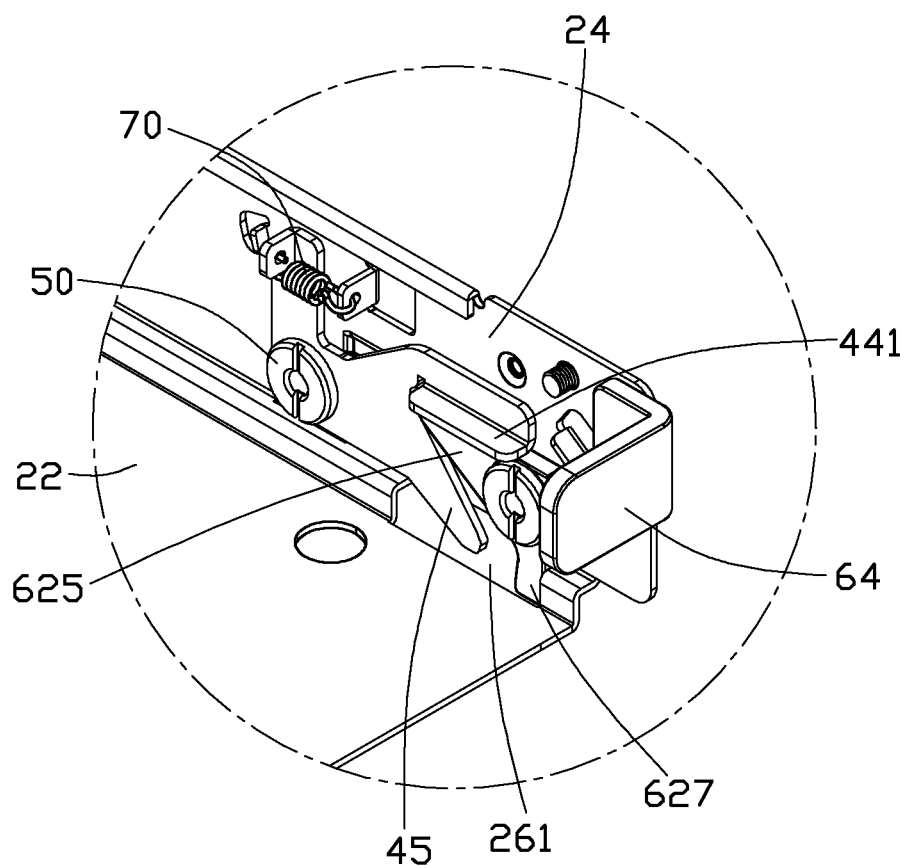
FIG. 5 is an enlarged view of circled portion V in FIG. 2.
Figure 6:
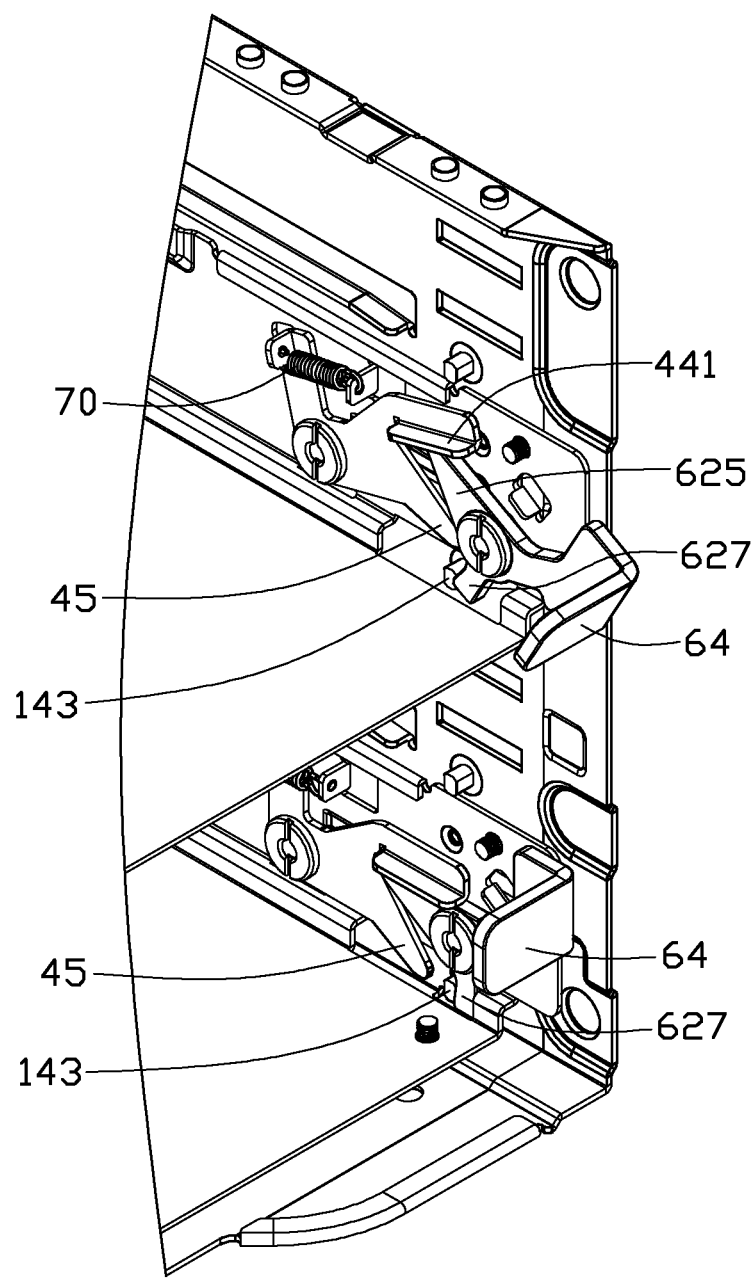
FIG. 6 is an enlarged partial view of the enclosure of FIG. 1.

Referring to FIG. 4, the second pivoting member 60 includes a main board 62 and an operating tab 64 substantially perpendicular to the main board 62. The main board 62 includes a first portion 621, a connecting portion 623, and a second portion 625. The first portion 621 and the operating tab 64 have a same height, and the connecting portion 623 is connected to the first portion 621 and the second portion 625. A top edge of the first portion 621 and a top edge of the operating tab 64 are located on a same plane, which is higher than a plane that includes a top edge of the second portion 625. A limiting portion 627 extends from a bottom edge of the second portion 625. A rotation hole 629, above the limiting portion 627, is defined in the second portion 625.

Referring to FIGS. 1-6, in assembly, one of the two mounting posts 241 is engaged in the rotation hole 629, and the other one of the two mounting posts 241 is engaged in the pivot hole 421. The two nuts 50 are engaged with the two mounting posts 241, respectively, to rotatably secure the first and second pivoting members 40, 60 to the inner surface of the side panel 24. A first end of the resilient member 70 is clipped into the mounting hole 461, and a second opposite end of the resilient member 70 is clipped into the securing hole 2431. Thus, the clipping assembly 30 can be secured to the side panel 24.

In an original position, the blocking tab 441 is substantially parallel to the bottom panel 22, and an axis of the resilient member 70 is substantially parallel to the bottom panel 22. The second resisting portion 45 extends into the opening 261, and the operating tab 64 is substantially perpendicular to the side panel 24 and the bottom panel 22. The second portion 625 extends into the cutout 43 and abuts the blocking tab 441. The limiting portion 627 extends into the opening 261, and a gap is defined between the limiting portion 627 and the second resisting portion 45.

In assembly of the receiving tray 20 to the chassis 10, the bottom plate 12 or the supporting pieces 141 support the receiving tray 20. The receiving tray 20 is located on a backside (away from the opening 261) of the chassis 10, and pushed towards the opening 261, until the blocking pin 143 reaches the opening 261. The receiving tray 20 is further moved, and the blocking pin 143 urges the second resisting portion 45 to rotate the first pivoting member 40 about the mounting post 241. The resilient member 70 is deformed, until the second resisting portion 45 extends through the blocking pin 143. The resilient member 70 is released, and the first pivoting member 40 rebounds to the original position. Then, the blocking pin 143 is located between the second resisting portion 45 and the limiting portion 627. Thus, the blocking pin 143 is blocked by the limiting portion 627, to prevent the receiving tray 20 from moving (see FIG. 6).

In disassembly, the operating tab 64 is operated, and the second pivoting member 60 is rotated clockwise about the mounting post 241. The second portion 625 drives the blocking tab 441, and the first pivoting member 40 rotates anti-clockwise. When the second resisting portion 45 is moved above the blocking pin 143 and away from the opening 261, the receiving tray 20 can be detached from the chassis 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure comprising:
    a chassis comprising a side plate, and a blocking pin located on the side plate;
    a receiving tray comprising a bottom panel and a side panel substantially perpendicular to the bottom panel, an opening defined in the receiving tray and located between the bottom panel and the side panel, and the blocking pin engaged in the opening;
    a clipping assembly comprising a first pivoting member that is rotatably attached to the side panel; and
    a resilient member, a first end of the resilient member is engaged with the first pivoting member, and a second end of the resilient member is engaged with the side panel; the resilient member comprising a longitudinal axis, and the axis of the resilient member is substantially parallel to the bottom panel;
    wherein the first pivoting member extends towards the opening to abut the blocking pin, for preventing the receiving tray from moving out of the chassis, and the first pivoting member is rotatable to be disengaged from the blocking pin, for allowing the receiving tray to move out of the chassis;
    wherein the clipping assembly further comprises a second pivoting member rotatably attached to the side panel, and the second pivoting member abuts the first pivoting member to rotate the first pivoting member.

2. The electronic device enclosure of claim 1, wherein the first pivoting member comprises a main body attached to an inner surface of the side panel, the main body comprises a first resisting portion and a second resisting portion located in the opening, a cutout is defined between the first resisting portion and the second resisting portion, and the second pivoting member is engaged in the cutout and abuts the first resisting portion.

3. The electronic device enclosure of claim 2, wherein the cutout is a triangle.

4. The electronic device enclosure of claim 2, wherein a blocking tab extends from the first resisting portion, and the blocking tab is substantially perpendicular to the first resisting portion and abuts the second pivoting member.

5. The electronic device enclosure of claim 4, wherein the second pivoting member comprises a main board and an operating tab substantially perpendicular to the main board, the main board comprises a first portion, a second portion, and a connecting portion connected to the first portion and the second portion; the first portion and the operating tab are located at a same height; and the second portion extends into the cutout and abuts the blocking tab.

6. The electronic device enclosure of claim 5, wherein a limiting portion extends from the second portion, and the limiting portion extends into the opening and abuts the blocking pin.

7. The electronic device enclosure of claim 5, wherein a top edge of the first portion and a top edge of the operating tab are located on a same plane, and a top edge of the second portion is substantially parallel to the top edge of the first portion and is lower than the top edge of the first portion.

8. The electronic device enclosure of claim 1, wherein the receiving tray further comprises an L-shaped connecting panel connected to the bottom panel and the side panel, and the opening is defined in the L-shaped connecting panel.

9. An electronic device enclosure comprising:
    a chassis comprising a side plate, and a blocking pin located on the side plate;
    a receiving tray comprising a bottom panel and a side panel connected to the bottom panel, an opening defined in the receiving tray and located between the bottom panel and the side panel, and the blocking pin is engaged in the opening;
    a clipping assembly comprising a first pivoting member attached to the side panel and a second pivoting member abutting the first pivoting member; and the first pivoting member being rotatable about a first axis, and the second pivoting member being rotatable about a second axis; the first pivoting member comprising a main body attached to an inner surface of the side panel, and the main body comprising a first resisting portion and a second resisting portion located in the opening; a cutout is defined between the first resisting portion and the second resisting portion, and the second pivoting member is engaged in the cutout and abuts the first resisting portion;
    wherein the first pivoting member extends towards the opening to abut the blocking pin, for preventing the receiving tray from moving out of the chassis, the second pivoting member is rotatable to rotate the first pivoting member, and the first pivoting member is disengaged from the blocking pin, for allowing the receiving tray to move out of the chassis.

10. The electronic device enclosure of claim 9, wherein the cutout is a triangle.

11. The electronic device enclosure of claim 9, wherein a blocking tab extends from the first resisting portion, and the blocking tab is substantially perpendicular to the first resisting portion and abuts the second pivoting member.

12. The electronic device enclosure of claim 11, wherein the second pivoting member comprises a main board and an operating tab substantially perpendicular to the main board, the main board comprises a first portion, a second portion, and a connecting portion connected to the first portion and the second portion; the first portion and the operating tab are located at a same height; and the second portion extends into the cutout and abuts the blocking tab.

13. The electronic device enclosure of claim 12, wherein a limiting portion extends from the second portion, and the limiting portion extends into the opening and abuts the blocking pin.

14. The electronic device enclosure of claim 12, wherein a top edge of the first portion and a top edge of the operating tab are located on a same plane, and a top edge of the second portion is substantially parallel to the top edge of the first portion and is lower than the top edge of the first portion.

15. The electronic device enclosure of claim 9, wherein the clipping assembly further comprises a resilient member, a first end of the resilient member is engaged with the first pivoting member, and a second end of the resilient member is engaged with the side panel.

16. The electronic device enclosure of claim 9, wherein the receiving tray further comprises an L-shaped connecting panel connected to the bottom panel and the side panel, and the opening is defined in the L-shaped connecting panel.

* * * * *